United States Patent
Fung et al.

(10) Patent No.: US 8,053,344 B1
(45) Date of Patent: Nov. 8, 2011

(54) METHODS OF FORMING INTEGRATED CIRCUITS

(75) Inventors: Ka-Hing Fung, Hsinchu (TW); Wei-Yuan Lu, Taipei (TW); Han-Ting Tsai, Kaoshiung (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 12/886,743

(22) Filed: Sep. 21, 2010

(51) Int. Cl.
*H01L 29/00* (2006.01)

(52) U.S. Cl. .. 438/561; 438/564; 438/249; 257/E21.135

(58) Field of Classification Search .................. 438/368, 438/369, 542, 545, 558, 561, 249, 564; 257/E21.135
See application file for complete search history.

(56) References Cited

U.S. PATENT DOCUMENTS
2006/0234504 A1  10/2006  Bauer et al.

OTHER PUBLICATIONS

Fischer, P. R., et al., "Lowe Temperature Silcore Deposition of Undopted and Doped Silicon Films", ECS Transactions, 3, (2) 203-215 (2006).

*Primary Examiner* — Jarrett Stark (74) *Attorney, Agent, or Firm* — Lowe Hauptman Ham & Berner, LLP (57) ABSTRACT

A method of forming an integrated circuit includes forming a gate structure over a substrate. At least one silicon-containing layer is formed in source/drain (S/D) regions adjacent to sidewalls of the gate structure. An N-type doped silicon-containing layer is formed over the at least one silicon-containing layer. The N-type doped silicon-containing layer has an N-type dopant concentration higher than that of the at least one silicon-containing layer. The N-type doped silicon-containing layer is annealed so as to drive N-type dopants of the N-type doped silicon-containing layer to the S/D regions.

19 Claims, 10 Drawing Sheets

METHODS OF FORMING INTEGRATED CIRCUITS

TECHNICAL FIELD

The present disclosure relates generally to the field of semiconductor devices, and more particularly, to methods of forming integrated circuits.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Generally, a plurality of ion implantations have been implemented for forming source/drain (S/D) regions, lightly-doped drain (LDD) regions, and pocket regions of transistors. For example, an N-type source/drain (NSD) process has a room-temperature phosphorus ion implantation that is provided to form a gradient dopant junction profile in a substrate. A room-temperature carbon ion implantation is then performed to the S/D regions to prevent over diffusion of phosphorus dopants into the substrate. A room-temperature arsenic ion implantation and a room-temperature phosphorus are performed to form S/D doped regions. After the multiple ion implantations, a rapid thermal anneal (RTA) is performed to active dopants and cure damage resulting from the ion implantations. Silicide is then formed at the top of the S/D doped regions.

As noted, the process described above uses the room-temperature phosphorus ion implantation to form the junction profile. When transistors are scaling down, the S/D junction profile may be too deep. The multiple ion implantations may also substantially damage the S/D regions. To cure the damage, a high thermal budget, e.g., a higher RTA temperature of about 1050° C. and/or a longer RTA time, may be applied. The high thermal budget may aggravate a short-channel effect (SCE) within the transistors. If a low thermal budget is applied, implantation damage may not be desirably cured. The low thermal budget may also result in transient-enhanced diffusion (TED).

It is understood that the following descriptions provide many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1:
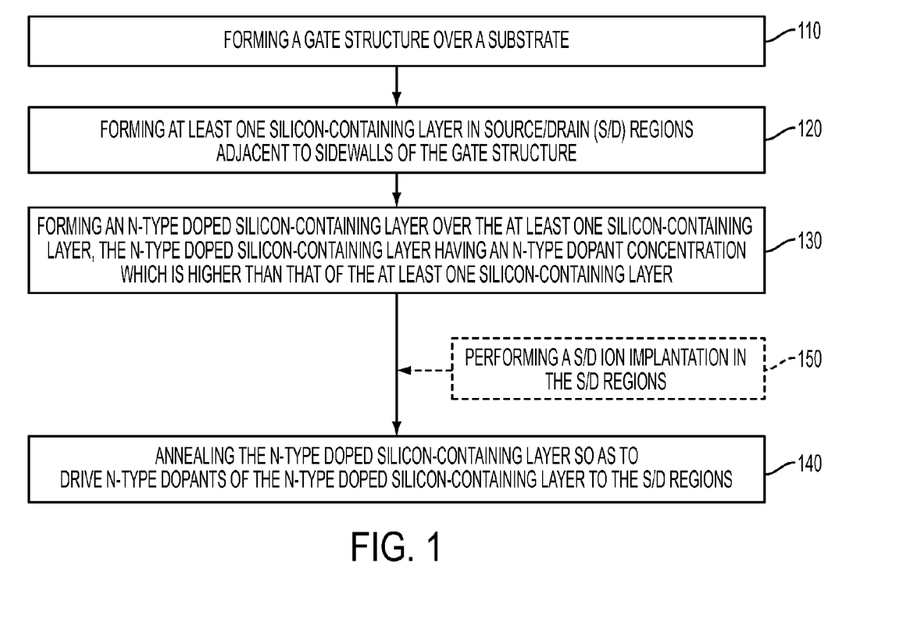
FIG. 1 is a flowchart illustrating an exemplary method of forming an integrated circuit.

Illustrated in FIG. 1 is a flowchart of an exemplary method of forming an integrated circuit. FIGS. 2A-2D are schematic cross-sectional views of an integrated circuit during various fabrication stages. The integrated circuit may include various passive and active microelectronic devices, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, or other types of transistors. It is understood that FIGS. 2A-2D have been simplified for a better understanding of the concepts of the present disclosure. Accordingly, it should be noted that additional processes may be provided before, during, and after the method 100 of FIG. 1, and that some other processes may only be briefly described herein.

Referring now to FIG. 1, the method 100 can include forming a gate structure over a substrate (block 110). The method 100 can include forming at least one silicon-containing layer in source/drain (S/D) regions adjacent to sidewalls of the gate structure (block 120). The method 100 can include forming an N-type doped silicon-containing layer over the at least one silicon-containing layer (block 130). The N-type doped silicon-containing layer has an N-type dopant concentration, which is higher than that of the at least one silicon-containing layer. The method 100 can include annealing the N-type doped silicon-containing layer so as to drive N-type dopants of the N-type doped silicon-containing layer to the S/D regions (block 140). In some embodiments, the method 100 can optionally include performing an N-type S/D ion implantation in the S/D regions (block 150). In other embodiments, the N-type S/D ion implantation can be arranged between forming the N-type doped silicon-containing layer and annealing the N-type doped silicon-containing layer. In some embodiments, the term "N-type S/D ion implantation" can mean an N-type highly-doped ion implantation that forms N-type highly-doped regions. In other embodiments, the term "N-type S/D ion implantation" can mean an N-type ion implantation having a dopant concentration of about 4E15 or above.

Figure 2A:
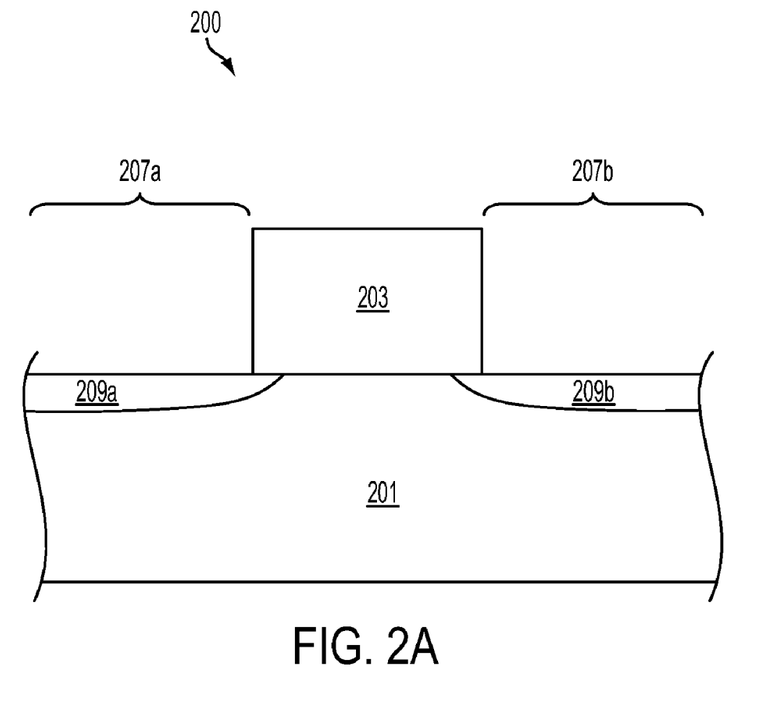
FIGS. 2A-2D are schematic cross-sectional views of an integrated circuit during various fabrication stages.

Referring now to FIGS. 2A-2D in conjunction with FIG. 1, an integrated circuit 200 can be fabricated in accordance with the method 100 of FIG. 1. In FIG. 2A, the integrated circuit 200 can have a substrate 201. In some embodiments forming N-type transistors, the substrate 201 can be a silicon substrate doped with a P-type dopant, such as boron (a P-type substrate). In other embodiments, the substrate 201 may alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrate 201 could include an epitaxial layer (epi layer), may be strained for performance enhancement, and may include a silicon-on-insulator (SOI) structure.

Referring again to FIG. 2A, a gate structure 203 can be formed over the substrate 201. In some embodiments forming N-type transistors, the integrated circuit 200 can include source/drain (S/D) regions, e.g., S/D regions 207a and 207b, adjacent to sidewalls of the gate structure 203. In some embodiments, the gate structure 203 can be a conductive gate structure, e.g., a polysilicon gate structure, a metal gate structure, a dummy gate structure, or any suitable gate structure. For example, a conductive gate structure can have a stack structure including a gate dielectric layer, a conductive material layer, and/or other suitable layers. A metal gate structure can have a stack structure including a high dielectric constant gate layer, a diffusion barrier layer, a metal work function layer, a metallic layer, and/or other suitable layers. A dummy gate structure can have a stack structure including a dummy material layer, a hard mask layer, and/or other suitable layers.

In some embodiments, N-type lightly-doped drains (LDDs) 209a and 209b can be formed in the substrate 201. Portions of the N-type LDDs 209a and 209b can be formed under the gate structure 203. The N-type LDDs 209a and 209b can be formed of n-type dopants (impurities). For example, the dopants can comprise phosphorous, arsenic, and/or other group V elements. In some embodiments, at least one thermal annealing process, e.g., a rapid thermal annealing (RTA) process, can be performed to activate the dopants of the N-type LDDs 209a and 209b. In some embodiments, the RTA process can have a spike annealing temperature of about 950° C.

Figure 2B:
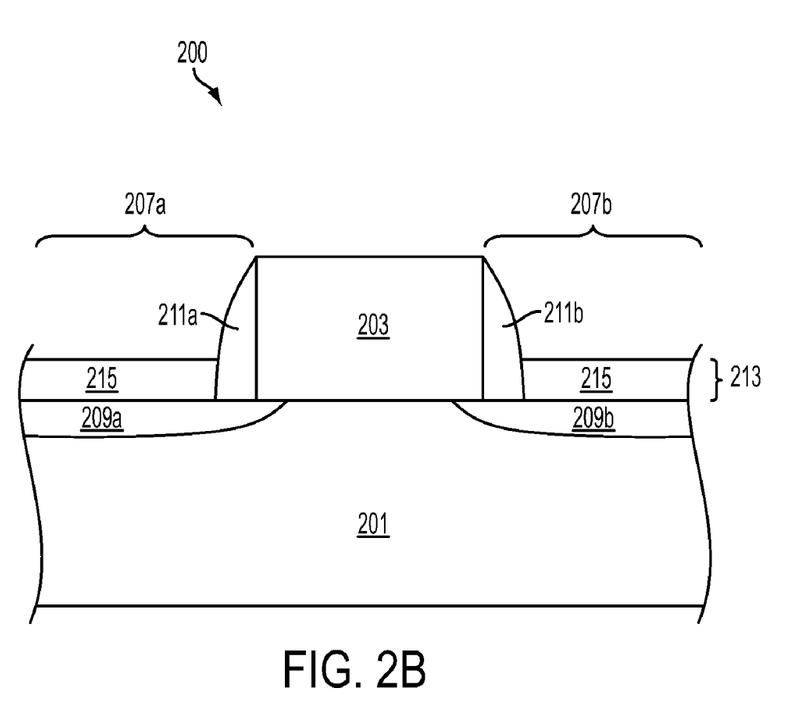

Referring to FIGS. 1 and 2B, the method 100 can include forming at least one silicon-containing layer in the S/D regions (block 120). For example, at least one silicon-containing layer 213 can be formed in the S/D regions 207a and 207b. In some embodiments, spacers 211a and 211b can be formed on the sidewalls of the gate structure 203 before forming the at least one silicon-containing layer 213. It is noted that though a single silicon-containing layer 213 is shown in FIG. 2B, the scope of this application is not limited thereto. In some embodiments, the at least one silicon-containing layer can be a multi-layer structure.

In some embodiments, the at least one silicon-containing layer 213 can include an undoped silicon-containing layer, e.g., an undoped silicon-containing layer 215. The undoped silicon-containing layer 215 can have a thickness ranging from about 50 Å to about 100 Å. In other embodiments, the at least one silicon-containing layer 213 can include a gradient N-type doped silicon-containing layer. In still other embodiments, the at least one silicon-containing layer 213 can be a multi-layer structure. The multi-layer structure can have a gradient N-type dopant profile increased from the bottom to the top. In some embodiments, the multi-layer structure can include an updoped silicon-containing layer 215 and an N-type lightly-doped silicon-containing layer (not shown). The N-type lightly-doped silicon-containing layer can have an N-type dopant concentration, which is lower than that of an N-type doped silicon-containing layer 220 described below in conjunction with FIG. 2C.

In some embodiments, the at least one silicon-containing layer 213 can include a silicon layer, a silicon carbide layer, a silicon-containing layer that is suitable for an N-type transistor, or any combinations thereof. The at least one silicon-containing layer 213 can be formed by chemical vapor deposition (CVD), e.g., low pressure CVD (LPCVD), atomic layer CVD (ALCVD), ultrahigh vacuum CVD (UHVCVD), reduced pressure CVD (RPCVD), any suitable CVD; molecular beam epitaxy (MBE) process; any suitable epitaxial process; or any combinations thereof.

Figure 2C:
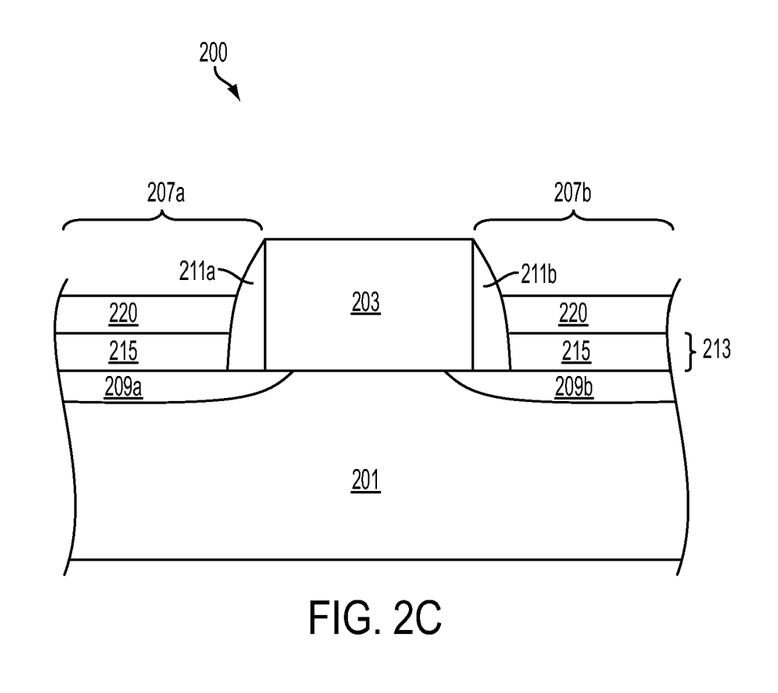

Referring to FIGS. 1 and 2C, the method 100 can include forming an N-type doped silicon-containing layer over the at least one silicon-containing layer (block 130). For example, an N-type doped silicon-containing layer 220 can be formed over the at least one silicon-containing layer 213 as shown in FIG. 2C. In some embodiments, the N-type doped silicon-containing layer 220 can have a thickness ranging from about 50 Å to about 100 Å.

The N-type doped silicon-containing layer 220 can have an N-type dopant concentration that is higher than that of the at least one silicon-containing layer 213. In some embodiments, the N-type doped silicon-containing layer 220 can have an N-type dopant concentration ranging from about 1E20 to about 1E21. In other embodiments, the N-type doped silicon-containing layer 220 can have an N-type dopant concentration ranging from about 4E20 to about 5E20. It is noted that though a single N-type doped silicon-containing layer 220 is shown in FIG. 2C, the scope of this application is not limited thereto. In some embodiments, the N-type doped silicon-containing layer 220 can be a multi-layer structure.

In some embodiments forming N-type transistors, the N-type doped silicon-containing layer 220 can include an N-type doped silicon layer, an N-type doped silicon carbide layer, an N-type doped silicon-containing layer that is suitable for an N-type transistor, or any combinations thereof. The N-type doped silicon-containing layer 220 can be formed by chemical vapor deposition (CVD), e.g., low pressure CVD (LPCVD), atomic layer CVD (ALCVD), ultrahigh vacuum CVD (UHVCVD), reduced pressure CVD (RPCVD), any suitable CVD; molecular beam epitaxy (MBE) process; any suitable epitaxial process; or any combinations thereof.

Figure 2D:
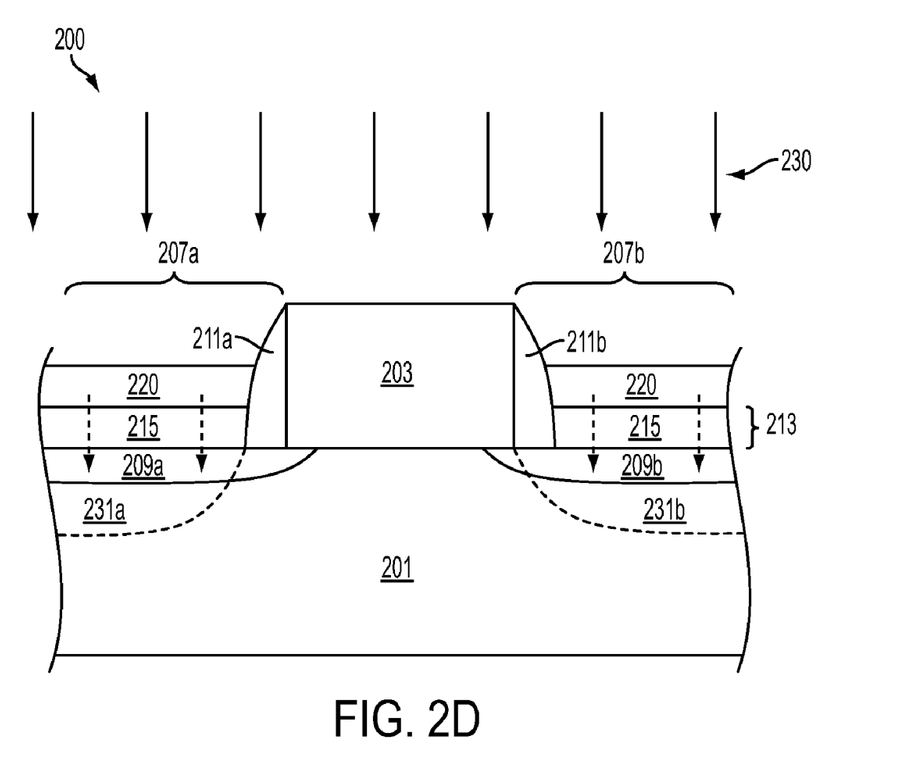

Referring to FIGS. 1 and 2D, the method 100 can include annealing the N-type doped silicon-containing layer so as to drive N-type dopants of the N-type doped silicon-containing layer to the S/D regions (block 140). For example, an annealing process 230 can anneal the N-type doped silicon-containing layer 220 so as to drive N-type dopants of the N-type doped silicon-containing layer 220 to the S/D regions 207a and 207b as shown in FIG. 2D. Dopants of the N-type doped silicon-containing layer 220, the at least one silicon-containing layer 213, and/or the N-type LDDs 209a-209b can be driven down to form N-type doped regions 231a and 231b.

As noted, the method 100 includes forming the at least one silicon-containing layer 213 to form a gradient dopant profile. The method 100 is free from including any ion implantation that is configured to form a gradient dopant profile between forming the N-type LDDs 209a-209b and forming the N-type doped silicon-containing layer 220.

In some embodiments, the annealing process 230 can include a rapid thermal annealing (RTA) process. The RTA process can activate the dopants of the N-type doped silicon-containing layer 220. In some embodiments, the RTA process can have a spike annealing temperature of about 1010° C. or lower. In some embodiments, silicide (not shown), e.g., nickel silicide, can be formed on the N-type doped silicon-containing layer 220.

In some embodiments, the undoped silicon-containing layer 215 can be an undoped silicon layer. The N-type doped silicon-containing layer 220 can be an N-type doped silicon layer that is doped with phosphorus. In some embodiments, the phosphorus-doped silicon layer can be referred to as a silicon phosphorus (SiP) layer.

It is found that the at least one silicon-containing layer 213 including the undoped silicon layer 215 and/or one or more lightly doped silicon layers (not shown) can serve as a diffusion barrier that can desirably prevent over diffusion of dopants of the SiP layer into the substrate 201 during the annealing process 230. With the diffusion barrier, shallow junctions in the S/D regions 207a and 207b can be achieved.

It is noted that the RTA process of the annealing process 230 has a spike annealing temperature of about 1010° C. or lower. The spike annealing temperature is substantially lower than a conventional annealing spike temperature of about 1050° C. By using the lower temperature RTA process, a high N-type dopant concentration can be retained at the top portion around the interface between the silicide (not shown) and the N-type doped silicon-containing layer 220. Source/drain resistances ($R_{csd}$) of the N-type transistor can be desirably reduced.

As noted, the N-type S/D ion implantation (block 150) is optional. In some embodiments without using an N-type S/D ion implantation, the N-type doped silicon-containing layer 220 is free from being subjected to implantation damage. Without the implantation damage, a transient enhanced diffusion (TED) of N-type dopants in the S/D regions 207a and 207b can be reduced. Shallow junctions in the S/D regions 207a and 207b can be achieved.

In other embodiments using an N-type S/D ion implantation, the N-type S/D ion implantation can have an implantation dosage, e.g., 1E15, which is lower than that, e.g., 4E15, of a conventional N-type S/D ion implantation incorporated in a process that does not use the N-type doped silicon-containing layer 220. With a lower implantation dosage, the N-type doped silicon-containing layer 220 is subjected to lower implantation damage. With the lower implantation damage, a transient enhanced diffusion (TED) of N-type dopants in the S/D regions 207a and 207b can be desirably reduced. Shallow junctions in the S/D regions 207a and 207b can be achieved.

It is noted that the processes of the method 100 described above in conjunction with FIGS. 1 and 2A-2D are merely exemplary. The method 100 can include different steps according to different process flows. For example, the gate structure 203 can be formed by a gate-first process or a gate-last process. In some embodiments using a gate-last process, the method 100 can include a gate replacing process. The gate structure 203 can be a dummy gate structure. The dummy gate structure 203 can include a dummy gate material and a hard mask material formed thereover. The dummy gate material can be made of at least one material such as polysilicon, amorphous silicon, silicon oxide, silicon nitride, or a material having an etching rate that is substantially different from the spacers (shown in FIG. 2B).

For the gate-last process, the hard mask materials and the dummy gate materials can be removed, for example, by a wet etch process, a dry etch process, or any combinations thereof. After removing the dummy gate materials, the method 100 can include forming gate electrode material within openings in which the dummy gate materials are disposed. In some embodiments, the gate electrode material can be a stack structure including a diffusion barrier layer, a metallic work function layer, a metallic conductive layer, and/or other suitable material layers.

In some embodiments, at least one high dielectric constant (high-k) layer (not shown) can be formed under the gate electrode material. The high-k dielectric layer can include high-k dielectric materials such as $HfO_2$, HfSiO, HfSiON, HfTaO, HfTiO, HfZrO, other suitable high-k dielectric materials, or any combinations thereof. In some embodiments, the high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, or any combinations thereof.

In some embodiments, the diffusion barrier can be configured to prevent metallic ions of the work function metal material from diffusing into the gate dielectric material. The diffusion barrier may comprise at least one material such as aluminum oxide, aluminum, aluminum nitride, titanium, titanium nitride (TiN), tantalum, tantalum nitride, other suitable material, and/or combinations thereof.

In some embodiments, the metallic work function layer can include at least one P-metal work function layer and/or at least one N-metal work function layer. The P-type work function materials can include compositions such as ruthenium, palladium, platinum, cobalt, nickel, and conductive metal oxides, and/or other suitable materials. The N-type metal materials can include compositions such as hafnium, zirconium, titanium, tantalum, aluminum, metal carbides (e.g., hafnium carbide, zirconium carbide, titanium carbide, aluminum carbide), aluminides, and/or other suitable materials. In some embodiments, the metallic conductive layer can be made of at least one material, such as aluminum, copper, Ti, TiN, TaN, Ta, TaC, TaSiN, W, WN, MoN, MoON, $RuO_2$, and/or other suitable materials.

In some embodiments, dielectric materials, contact plugs, via plugs, metallic regions, and/or metallic lines (not shown) can be formed over the gate electrode portions for interconnection. The dielectric layers may include materials such as silicon oxide, silicon nitride, silicon oxynitride, low-k dielectric material, ultra low-k dielectric material, or any combinations thereof. The via plugs, metallic regions, and/or metallic lines can include materials such as tungsten, aluminum, copper, titanium, tantalum, titanium nitride, tantalum nitride, nickel silicide, cobalt silicide, other proper conductive materials, and/or combinations thereof. The via plugs, metallic regions, and/or metallic lines can be formed by any suitable processes, such as deposition, photolithography, etching processes, and/or combinations thereof.

Figure 3A:
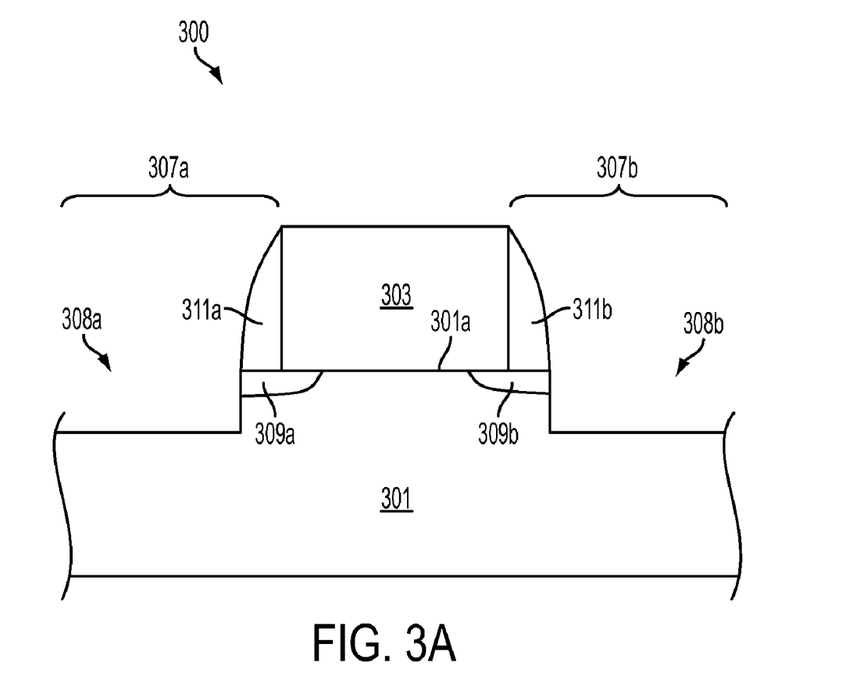
FIGS. 3A-3D are schematic cross-sectional views illustrating an exemplary method of forming an integrated circuit.

FIGS. 3A-3D are schematic cross-sectional views illustrating an exemplary method of forming an integrated circuit. Items of FIGS. 3A-3D that are the same items in FIGS. 2A-2D are indicated by the same reference numerals, incremented by 100. Referring to FIG. 3A, recesses 308a and 308b are formed in S/D regions 307a and 307b, respectively. In some embodiments, the recesses 308a and 308b each can have a depth ranging from about 200 Å to about 400 Å. The recesses 308a and 308b can be formed by, for example, a dry etch process.

Figure 3B:
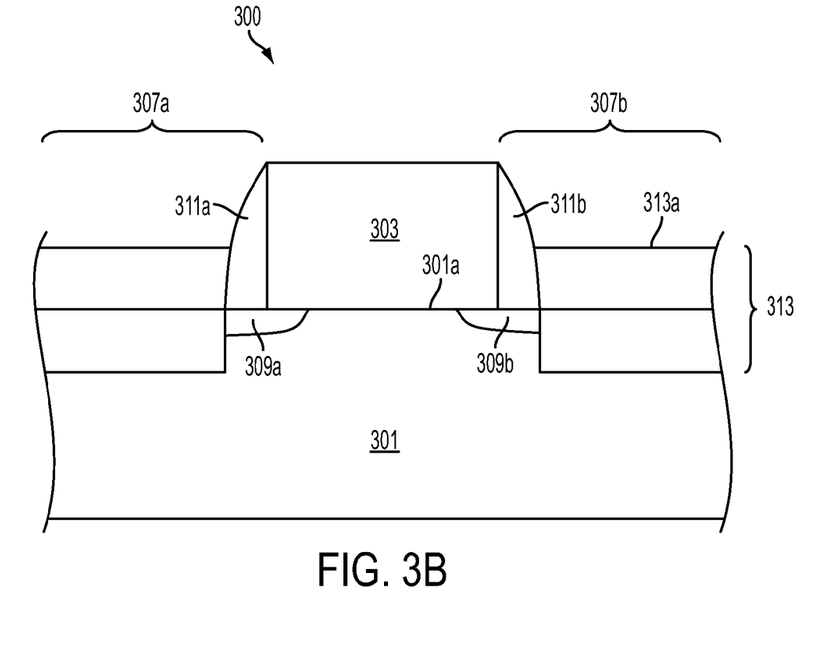

Referring to FIG. 3B, at least one silicon-containing layer 313 can be formed in the recessed S/D regions 307a and 307b. The top surface 313a of the at least one silicon-containing layer 313 is higher than the top surface 301a of the substrate 301. In at least this embodiment, the at least one silicon-containing layer 313 can include a multi-layer structure. The multi-layer structure can have gradient N-type dopant concentrations from the bottom to the top. For example, the multi-layer structure can include an updoped silicon-containing layer and an N-type lightly-doped silicon-containing layer (not shown). The N-type lightly-doped silicon-containing layer can have an N-type dopant concentration, which is lower than that of the N-type doped silicon-containing layer 320 described below in conjunction with FIG. 3C.

Figure 3C:
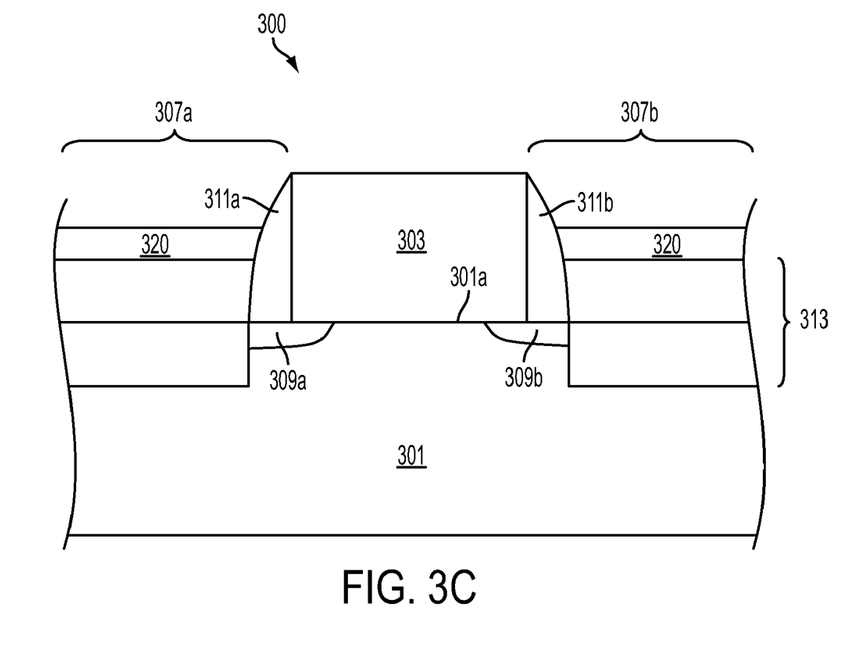

Referring to FIG. 3C, the N-type doped silicon-containing layer 320 can be formed over the at least one silicon-containing layer 313. In some embodiments, the N-type doped silicon-containing layer 320 can have a thickness ranging from about 50 Å to about 100 Å.

Figure 3D:
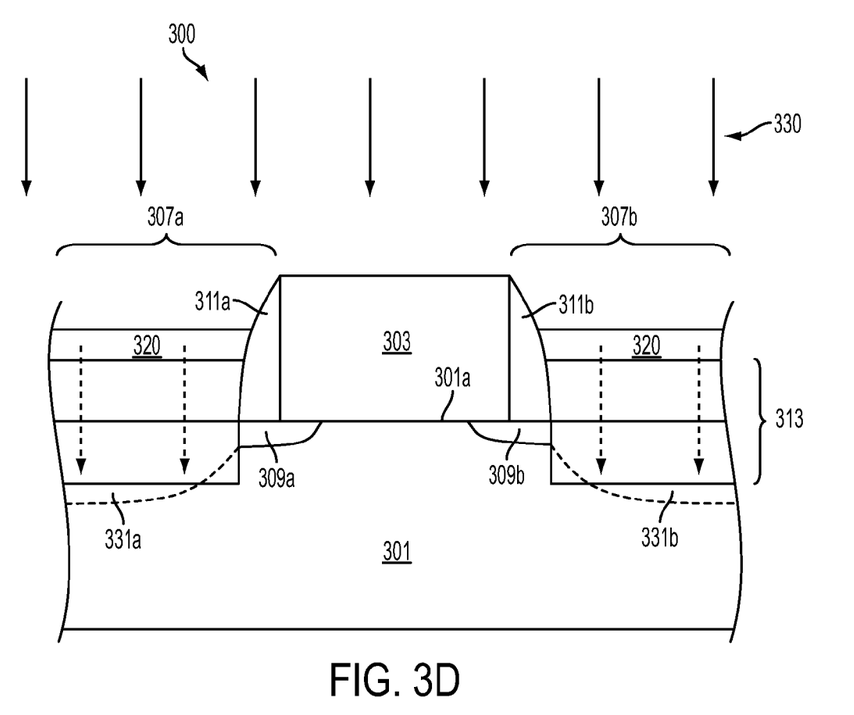

Referring to FIG. 3D, an annealing process 330 can anneal the N-type doped silicon-containing layer 320 so as to drive N-type dopants of the N-type doped silicon-containing layer 320 in the S/D regions 307a and 307b. Dopants of the N-type doped silicon-containing layer 320, the at least one silicon-containing layer 313, and/or the N-type LDDs 309a-309b can be driven down to form N-type doped regions 331a and 331b. In some embodiments, the annealing process 330 can include a rapid thermal annealing (RTA) process. The RTA process can activate the dopants of the N-type doped silicon-containing layer 320. In some embodiments, the RTA process can have a spike annealing temperature of about 1010° C. or lower. In some embodiments, silicide (not shown), e.g., nickel silicide, can be formed on the N-type doped silicon-containing layer 320.

It is noted that the at least one silicon-containing layer 313 can be disposed in the recesses 308a and 308b (shown in FIG. 3A). The at least one silicon-containing layer 313 can have a multi-layer structure that has a gradient N-type dopant profile. Dopants from the at least one silicon-containing layer 313 and/or the N-type doped silicon-containing layer 320 can desirably form shallow junctions in the substrate 301.

As noted, the N-type S/D ion implantation (block 150) is optional. In some embodiments without using an N-type S/D ion implantation, the N-type doped silicon-containing layer 320 is free from being subjected to implantation damage. Without the implantation damage, a transient enhanced diffusion (TED) of N-type dopants in the S/D regions 307a and 307b can be desirably reduced. Shallow junctions can be achieved.

Figure 4:
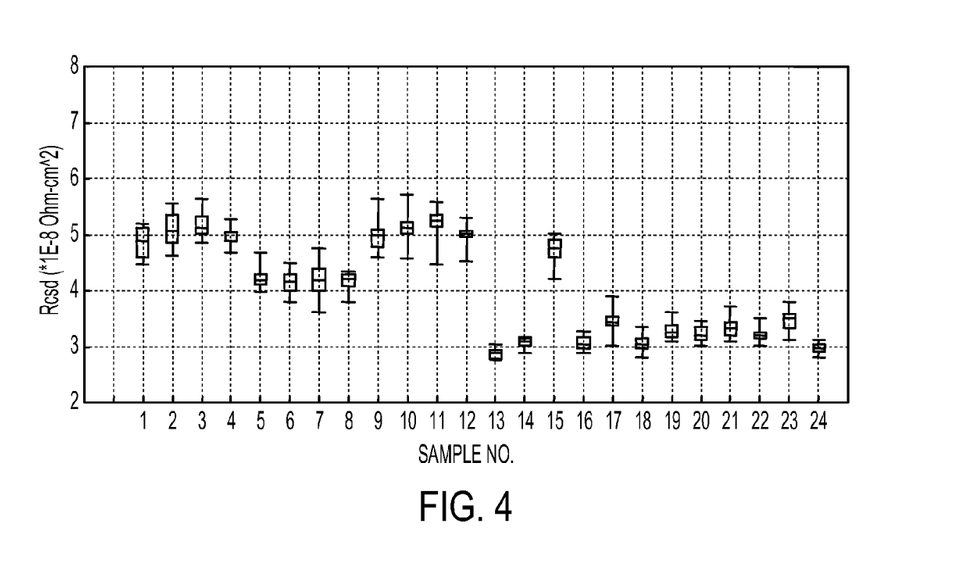
FIG. 4 is a schematic drawing illustrating source/drain resistances ($R_{csd}$) of N-type transistors formed by various processes.

FIG. 4 is a schematic drawing illustrating source/drain resistances ($R_{csd}$) of N-type transistors formed by various processes. In FIG. 4, samples 1-12 each include S/D regions formed by an N-type source/drain (NSD) process. The NSD process includes an N-type S/D ion implantation without the N-type doped silicon-containing layer 320. Samples 13-24 each include S/D regions formed by recessing substrates as shown in FIG. 3A. An N-type doped silicon-containing layer 320, e.g., a SiP layer, is formed in each recess of the substrates. The SiP layer has a dopant concentration of about 5E20. The samples 13-24 are not subjected to any S/D ion implantation between forming the N-type doped silicon-containing layer 320 and annealing the N-type doped silicon-containing layer 320 as described above in conjunction with FIG. 3D.

It is found that the average S/D junction depth of the samples 1-12 is about 250 Å. The average S/D junction depth of the samples 13-24 is about 210 Å. It is also found that the average S/D resistance ($R_{csd}$) of samples 1-12 is about 4.2E-8 $\Omega/cm^2$, which is higher than the average S/D resistance ($R_{csd}$), about 2.9E-8 $\Omega/cm^2$, of samples 13-24. Accordingly, the junction depth and the S/D resistance of N-type transistors can be reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:
    forming a gate structure over a substrate;
    forming at least one silicon-containing layer in recessed source/drain (S/D) regions adjacent to sidewalls of the gate structure;
    forming an N-type doped silicon-containing layer over the at least one silicon-containing layer, the N-type doped silicon-containing layer having an N-type dopant concentration higher than that of the at least one silicon-containing layer; and
    annealing the N-type doped silicon-containing layer so as to drive N-type dopants of the N-type doped silicon-containing layer to the S/D regions.

2. The method of claim 1, wherein the at least one silicon-containing layer comprises an undoped silicon-containing layer.

3. The method of claim 2, wherein the at least one silicon-containing layer further comprises an N-type lightly-doped silicon-containing layer, and the N-type light-doped silicon-containing layer has an N-type dopant concentration which is lower than that of the N-type doped silicon-containing layer.

4. The method of claim 1, wherein the at least one silicon-containing layer comprises a gradient N-type doped silicon-containing layer.

5. The method of claim 1, wherein the N-type dopant concentration of the N-type doped silicon-containing layer ranges from about 1E20 to about 1E21.

6. The method of claim 1, wherein the annealing process comprises a rapid thermal annealing process which has a spike anneal temperature of about 1010° C. or lower.

7. The method of claim 1, wherein a top surface of the at least one silicon-containing layer is higher than a top surface of the substrate.

8. The method of claim 1, further comprising:
    forming N-type lightly-doped drains (LDDs) under the gate structure, wherein the method is free from including any ion implantation that is configured to form a gradient dopant profile between forming the N-type LDDs and forming the N-type doped silicon-containing layer.

9. A method of forming an integrated circuit, the method comprising:
    forming a gate structure over a substrate;

recessing source/drain (S/D) regions adjacent to sidewalls of the gate structure;

epitaxially forming at least one silicon layer over the recessed S/D regions;

epitaxially forming an N-type doped silicon layer over the at least one silicon layer, the N-type doped silicon layer having an N-type dopant concentration which is higher than that of the at least one silicon layer; and annealing the N-type doped silicon layer so as to drive N-type dopants of the N-type doped silicon layer to the S/D regions.

10. The method of claim 9, wherein the at least one silicon layer comprises an undoped silicon layer.

11. The method of claim 10, wherein the at least one silicon layer further comprises an N-type lightly-doped silicon layer, and the N-type lightly-doped silicon layer has an N-type dopant concentration which is lower than that of the N-type doped silicon layer.

12. The method of claim 9, wherein the at least one silicon layer comprises a gradient N-type doped silicon layer.

13. The method of claim 9, wherein the N-type dopant concentration of the N-type doped silicon layer ranges from about 1E20 to about 1E21.

14. The method of claim 9, wherein the annealing process comprises a rapid thermal annealing process which has a spike annealing temperature of about 1010° C. or lower.

15. The method of claim 9, wherein a top surface of the at least one silicon layer is higher than a top surface of the substrate.

16. The method of claim 9, wherein the method is free from including a S/D ion implantation between epitaxially forming the N-type doped silicon layer and annealing the N-type doped silicon layer.

17. A method of forming an integrated circuit, the method comprising:

forming a gate structure over a substrate;

recessing source/drain (S/D) regions adjacent to sidewalls of the gate structure;

epitaxially forming at least one silicon layer over the recessed S/D regions;

epitaxially forming an N-type doped silicon layer over the at least one silicon layer, the N-type doped silicon layer having an N-type dopant concentration ranging from about 1E20 to about 1E21; and annealing the N-type doped silicon layer so as to drive N-type dopants of the N-type doped silicon layer to the S/D regions, wherein the method is free from including a S/D ion implantation between epitaxially forming the N-type doped silicon layer and annealing the N-type doped silicon layer.

18. The method of claim 17, wherein the at least one silicon layer comprises an undoped silicon layer.

19. The method of claim 18, wherein the at least one silicon layer further comprises an N-type lightly-doped silicon layer, and the N-type lightly-doped silicon layer has an N-type dopant concentration which is lower than that of the N-type doped silicon layer.

* * * * *